(12) United States Patent
Xu et al.

(10) Patent No.: US 11,683,607 B2
(45) Date of Patent: Jun. 20, 2023

(54) IMAGE SENSOR WITH THREE READOUT APPROACH FOR PHASE DETECTION AUTOFOCUS AND IMAGE SENSING PIXELS

(71) Applicant: OMNIVISION TECHNOLOGIES, INC., Santa Clara, CA (US)

(72) Inventors: Chengcheng Xu, San Jose, CA (US); Rui Wang, San Jose, CA (US); Wei Deng, Sunnyvale, CA (US); Chun-Sheng Yang, Cupertino, CA (US); Xueqing Wang, Milpitas, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 18 days.

(21) Appl. No.: 17/342,383

(22) Filed: Jun. 8, 2021

(65) Prior Publication Data
US 2022/0394201 A1    Dec. 8, 2022

(51) Int. Cl.
| | | |
|---|---|---|
| *H04N 25/75* | (2023.01) | |
| *H01L 27/146* | (2006.01) | |
| *H01L 27/148* | (2006.01) | |
| *H04N 25/704* | (2023.01) | |
| *H04N 25/772* | (2023.01) | |
| *H04N 25/44* | (2023.01) | |
| *H04N 25/778* | (2023.01) | |

(52) U.S. Cl.
CPC ....... *H04N 25/75* (2023.01); *H01L 27/14612* (2013.01); *H01L 27/14643* (2013.01); *H01L 27/14831* (2013.01); *H04N 25/704* (2023.01); *H04N 25/772* (2023.01)

(58) Field of Classification Search
CPC ............... H04N 5/378; H04N 5/36961; H04N 5/37455; H04N 5/232122; H04N 5/3696; H04N 5/3745; H04N 5/37457; H04N 25/75; H04N 25/704; H04N 25/772; H04N 25/44; H04N 25/778; H01L 27/14612; H01L 27/14643; H01L 27/14831
See application file for complete search history.

(56) References Cited

U.S. PATENT DOCUMENTS

| | | | | |
|---|---|---|---|---|
| 10,523,860 B2* | 12/2019 | Hamano | ................... | G02B 7/36 |
| 10,965,896 B2* | 3/2021 | Matsumura | ........... | H04N 5/3651 |
| 2016/0353005 A1* | 12/2016 | Kaibara | ........... | H04N 5/232122 |

(Continued)

*Primary Examiner* — Albert H Cutler
(74) *Attorney, Agent, or Firm* — Perkins Coie LLP

(57) ABSTRACT

An imaging device includes a plurality of photodiodes arranged in a photodiode array to generate charge in response to incident light. The plurality of photodiodes includes first and second photodiodes. A shared floating diffusion receives charge transferred from the first and second photodiodes. An analog to digital converter (ADC) performs a first ADC conversion to generate a reference readout in response to charge in the shared floating diffusion after a reset operation. The ADC is next performs a second ADC conversion to generate a first half of a phase detection autofocus (PDAF) readout in response to charge transferred from the first photodiode to the shared floating diffusion. The ADC then performs a third ADC conversion to generate a full image readout in response to charge transferred from the second photodiode combined with the charge transferred previously from the first photodiode in the shared floating diffusion.

13 Claims, 4 Drawing Sheets

(56) References Cited

U.S. PATENT DOCUMENTS

2019/0019835 A1\* 1/2019 Tanaka ............... H04N 9/04557
2020/0161352 A1 5/2020 Takahashi et al.
2021/0014436 A1\* 1/2021 Nobuoka ............... H04N 5/361

\* cited by examiner

IMAGE SENSOR WITH THREE READOUT APPROACH FOR PHASE DETECTION AUTOFOCUS AND IMAGE SENSING PIXELS

BACKGROUND INFORMATION

Field of the Disclosure

This disclosure relates generally to image sensors, and in particular but not exclusively, relates to image sensors that include phase detection autofocus and image sensing pixels.

Background

Image sensors have become ubiquitous and are now widely used in digital cameras, cellular phones, security cameras as well as in medical, automotive, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing. The technology used to manufacture image sensors has continued to advance at a great pace. For example, the demands of higher resolution and lower power consumption have encouraged the further miniaturization and integration of these devices.

A typical complementary metal oxide semiconductor (CMOS) image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which are read out as analog signals from the column bitlines and converted to digital values to produce digital images (i.e., image data) that represent the external scene.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
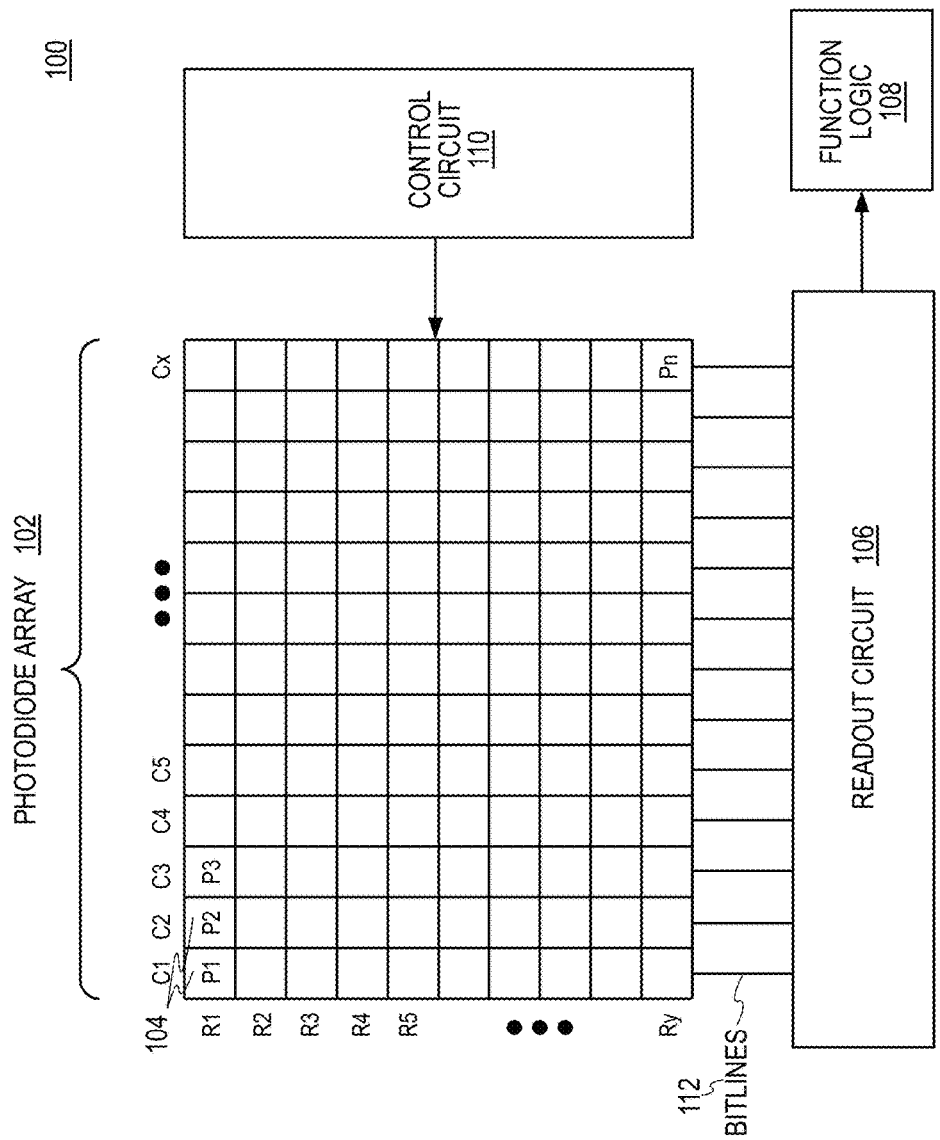
FIG. 1 illustrates one example of an imaging system including a photodiode array in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Examples directed to an imaging system including a photodiode array with phase detection autofocus and image sensing photodiodes are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system including a photodiode array with phase detection autofocus (PDAF) and image sensing photodiodes are described. In various examples, the imaging system includes an imaging device with a plurality of photodiodes arranged in the photodiode array that generate charge in response to incident light. In the various examples, all photodiodes in the photodiode array can be used for both phase detection autofocus and image sensing. As such, all of the photodiodes in the photodiode array may have the same kind of microlenses, as well as color filters. In the various examples, the plurality of photodiodes includes at least a first photodiode and a second photodiode. In one example the first and second photodiodes are neighboring photodiodes in the photodiode array. A shared floating diffusion is configured to receive charge transferred from the first and second photodiodes. An analog to digital converter (ADC) is configured to perform a first ADC conversion to generate a reference readout in response to charge in the shared floating diffusion after a reset operation. The ADC is next configured to perform a second ADC conversion to generate a first half of a PDAF readout in response to charge transferred from the first photodiode to the shared floating diffusion. The ADC is then configured to perform a third ADC conversion to generate a full image readout in response to charge transferred from the second photodiode combined with the charge transferred previously from the first photodiode in the shared floating diffusion.

As will be shown in the various examples, the photodiodes in the photodiode array may be arranged in 2×2 groupings of photodiodes, which include neighboring pairs of photodiodes. In one example, the 2×2 groupings of photodiodes share the same color filter that provide 4C Bayer binning of the imaging device.

The imaging device also includes a plurality of transfer transistors, with each one of the plurality of transfer transistors coupled to a corresponding one of the plurality photodiodes. The plurality of transfer transistors includes a first transfer transistor coupled between the first photodiode and the shared floating diffusion, and a second transfer transistor coupled between the second photodiode and the shared floating diffusion.

A reset transistor is coupled between the shared floating diffusion and a voltage supply. A source follower transistor is also included. The source follower transistor has a gate that is coupled to the shared floating diffusion and a source that is coupled to a column bitline. In one example, the source of the source follower transistor is coupled to the column bitline through a row select transistor.

In the examples, the ADC is configured to perform the first ADC conversion in response to the reset transistor being pulsed while the first and second transfer transistors are turned off to reset the shared floating diffusion to determine a reference readout. The ADC is next configured to perform the second ADC conversion in response to the first transfer transistor being pulsed while the reset transistor and the second PDF transfer transistors are turned off to determine a first half of a PDAF readout. The ADC is then configured to perform a third ADC conversion in response to the second transfer transistor being pulsed while the reset transistor and the first transfer transistors are turned off to determine a full image readout.

The first half of the PDAF readout may then be determined in response to determining a difference between the second ADC conversion and the first ADC conversion. A second half of a PDAF readout may be determined in response to determining a difference between the third ADC conversion and the second ADC conversion. PDAF information may be determined in response to evaluating the first half and second half PDAF readouts relative to each other. The full image readout may be determined in response to determining the difference between the third ADC conversion and the first ADC conversion. As such, both PDAF and image sensing readouts may be determined from the photodiodes of the imaging device with the three readouts and ADC conversions in accordance with the teachings of the present invention.

To illustrate, FIG. 1 illustrates one example of an imaging system 100 including an imaging device with an array of photodiodes in accordance with the teachings of the present invention. In particular, imaging system 100 includes a photodiode array 102, a control circuit 110, a readout circuit 106, and function logic 108. In one example, photodiode array 102 is a two-dimensional (2D) array of photodiodes 104, (e.g., P1, P2, . . . , Pn), which can be utilized for both phase detection autofocus as well as image sensing in accordance with the teachings of the present invention. As illustrated in the depicted example, photodiodes 104 are arranged into rows (e.g., R1 to Ry) and columns (e.g., C1 to Cx) to acquire image data and/or focus data of a person, place, object, etc., which can then be used to focus, acquire, and render a 2D image of the person, place, object, etc.

In one example, each photodiode 104 in photodiode array 102 is configured to photogenerate image charge and/or phase detection autofocus charge in response to incident light. The image charge and/or phase detection autofocus charge generated in each photodiode 104 is transferred to a shared floating diffusion in each pixel circuit, which is converted to an image signal or a phase detection autofocus signal, which is then read out from each pixel circuit by readout circuit 106 through column bitlines 112. In various examples, the signals read out from photodiode array 102 may be amplified, digitized, and then transferred to function logic 108. In various examples, the readout circuit 106 includes amplification circuitry, analog to digital converters (ADC), or otherwise. In one example, the readout circuit 106 may read out a row of data at a time along column bitlines 112 as illustrated in FIG. 1, or may read out the data using a variety of other techniques (not illustrated), such as a serial readout or a full parallel readout of all pixel circuits simultaneously. The function logic 108 may store the image data or even manipulate the image data by applying post image effects (e.g., crop, rotate, remove red eye, adjust brightness, adjust contrast, or otherwise).

Figure 2:
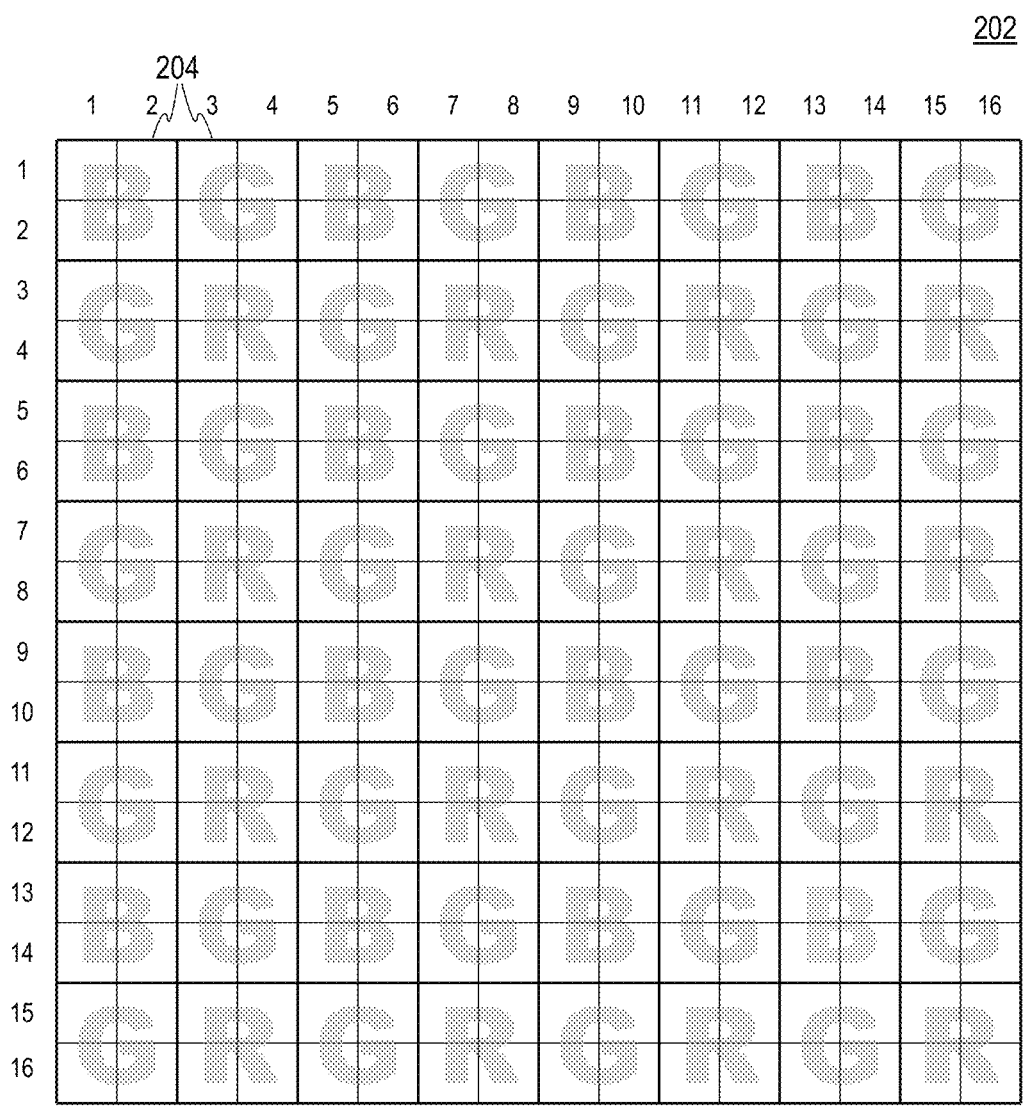
FIG. 2 illustrates a one example of a photodiode array in accordance with the teachings of the present disclosure.

FIG. 2 illustrates one example of a photodiode array 202 of photodiodes 204 in accordance with the teachings of the present disclosure. In particular, the example depicted in FIG. 2 illustrates the photodiode array 202, which includes a plurality of photodiodes 204 arranged in rows and columns in the photodiode array to generate charge in response to incident light. In the various examples, the plurality of photodiodes 204 are arranged in at least neighboring pairs in the photodiode array 202. As will be described in greater detail, each neighboring pair of photodiodes includes a first photodiode and a second photodiode.

The example depicted in FIG. 2 illustrates that photodiode array 202 is implemented in a color pixel array that includes 2×2 groupings of photodiodes that are disposed under a 4C color filter array. It is noted that each 2×2 grouping of photodiodes can be considered as two neighboring pairs of photodiodes included in each 2×2 grouping. In another example, it is appreciated that photodiode array 202 may have different arrangements, such as for example single pairs (e.g., 2×1) of neighboring photodiodes.

In the example depicted in FIG. 2, it is appreciated that the photodiodes 204 of the photodiode array 202 are binned. As such, information that is generated from each photodiode 204 is summed or combined with information generated from one or more nearby binned photodiodes 204 to generate combined information, and therefore sum the performance of each individual photodiode 204 to improve the performance of the photodiode array 202. For instance, in various examples, 2×2 groupings of photodiodes 204 are configured to be binned such that the 4 photodiodes 204 included in each grouping all share the same color. In other words, the photodiodes 204 are arranged in the photodiode array 202 such that each 2×2 grouping of image sensing photodiodes is either red (R), green (G), or blue (B). In one example, the 2×2 groupings of binned photodiodes 204 are all adjacent photodiodes in the photodiode array 202 and share the same color filter. In the example, Bayer binning is provided for the 2×2 groupings of red (R) color filters, 2×2 groupings of green (G) color filters, and 2×2 groupings of blue (B) color filters, which are disposed over the photodiodes. In one example, it is appreciated that microlenses may also be disposed over the photodiodes but are not illustrated so as not to obscure the teachings of the present invention.

In operation, phase detection information is retrieved from the imaging device by comparing or evaluating the signals from one side of the 2×2 groupings of photodiodes with signals from the other side of the 2×2 groupings of photodiodes. For instance, in one example, the signals from horizontally adjacent pairs are compared. In other words, the left side pair (e.g., left half) of photodiodes are compared with the signals from the right side pair (e.g., right half) of photodiodes of the 2×2 groupings of photodiodes. In another example, the signals from vertically adjacent pairs are compared. In other words, the top side pair (e.g., top half) of photodiodes are compared with the signals from the bottom side pair (e.g., bottom half) of photodiodes of the 2×2 groupings of photodiodes. In still another example with 2×1 groupings of photodiodes (not shown in FIG. 2), the signals from the left side or top side (e.g., left half or top half) photodiodes are compared with the signals from the right side or bottom side (e.g., right half or bottom half) photodiodes of the 2×1 groupings of photodiodes.

As will be described in greater detail below, in one example during operation, the pixel circuits of the photodiodes of photodiode array 202 are all reset and then signals are read out from the pixel circuits and digitized during a first ADC conversion to determine a reference value. Next, the signals from the left two photodiodes of each 2×2 grouping of photodiodes are read out and digitized during a second ADC conversion to determine a first half of a PDAF readout. Then, the signals from the right two photodiodes of each 2×2 grouping of pixels are then combined with the signals from the left two photodiodes and read out and digitized during a third ADC conversion to determine a full image readout in accordance with the teachings of the present invention. It is appreciated that the single reference value determined in response to the first ADC conversion may be utilized to determine a correlated double sampling (CDS) readouts of the signals in accordance with the teachings of the present invention.

Thus, it is appreciated that the signals are read out from photodiode array 202 without having to reset the pixel circuits a second time between the readout of the left two photodiodes and the readout of the right two photodiodes of each 2×2 grouping of photodiodes. In other words, the PDAF data as well as image sensing data can be obtained with three readouts instead of four readouts in accordance with the teachings of the present invention. It is appreciated that with only three readouts instead of four readouts, noise performance as well as frame rate performance is improved in accordance with the teachings of the present invention.

For instance, if it is assumed that the noise of one CDS readout of a 4C grouping of photodiodes is $N_{CDS}$, and that if a conventional readout of a 4C grouping of photodiodes requires a combination of two CDS readouts, then the noise is increased by $\sqrt{2}$ times, or to $\sqrt{2} * N_{CDS}$ In comparison, with the three readout approach of the photodiodes in accordance with the teachings of the present invention, only one readout is utilized to determine the reference value, which results in a noise performance closer to $N_{CDS}$ instead of $\sqrt{2} * N_{CDS}$ As such, the noise performance is improved since longer times to obtain CDS readings degrades noise performance.

Furthermore, if it is assumed that the frame rate of one CDS readout of a 4C grouping of PDAF photodiodes is M, and that if a conventional readout of a 4C grouping of photodiodes requires a combination of two CDS readouts, then the frame rate is reduced by a factor of two, or reduced to $$\frac{1}{2} * M.$$

In comparison, with the three readout approach of the photodiodes in accordance with the teachings of the present invention, only one readout is utilized to determine the reference value, which results in an overall frame rate performance of approximately $$\frac{2}{3} * M.$$

Figure 3:
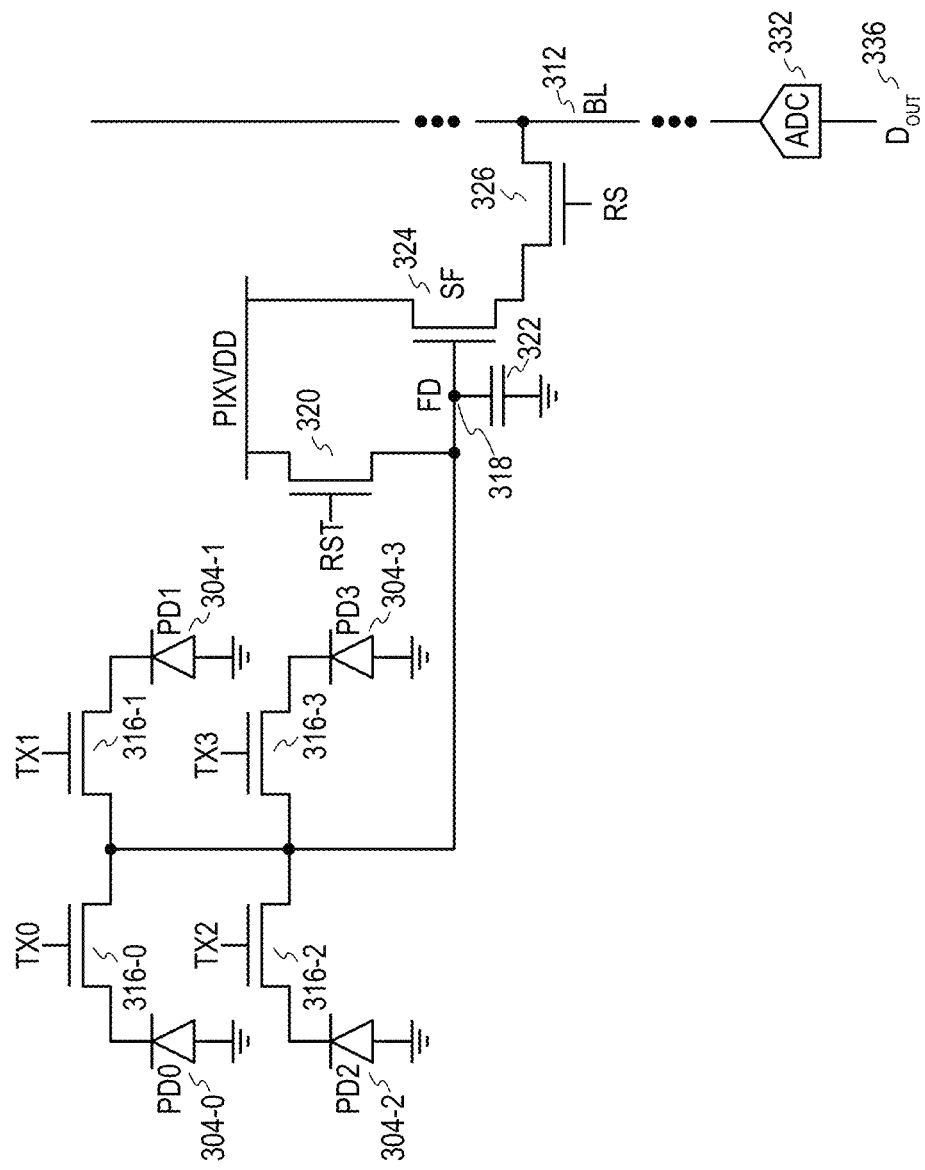
FIG. 3 illustrates one example schematic of a pixel circuit included in an imaging system with a photodiode array in accordance with the teachings of the present invention.

FIG. 3 illustrates one example schematic of a pixel circuit 314 included in an imaging system with a photodiode array in accordance with the teachings of the present invention. It is appreciated the pixel circuit 314 of FIG. 3 may be an example of one of the pixel circuits coupled to the photodiodes 204 included in photodiode array 202 as shown in FIG. 2, or an example of one of the pixel circuits coupled to the photodiodes 104 included in photodiode array 102 as shown in FIG. 1, and that similarly named and numbered elements described above are coupled and function similarly below.

In the example depicted in FIG. 3, pixel circuit 314 includes a photodiode 304-0 coupled to a transfer transistor 316-0, a photodiode 304-1 coupled to a transfer transistor 316-1, a photodiode 304-2 coupled to a transfer transistor 316-2, and a photodiode 304-3 coupled to a transfer transistor 316-3. Thus, each one of the plurality of transfer transistors 316-0 to 316-3 is coupled to a respective one of the plurality of photodiodes 304-0 to 304-3.

In the example, a shared floating diffusion 318 is coupled to transfer transistor 316-0, transfer transistor 316-1, transfer transistor 316-2, and transfer transistor 316-3. As such, each one of the plurality of transfer transistors 316-0 to 316-3 is coupled between a respective one of the plurality of photodiodes 304-0 to 304-3 and shared floating diffusion 318. As will be discussed in the various examples, floating diffusion 318 is a shared floating diffusion that is configured to receive charge that is transferred from the plurality of photodiodes 304-0 to 304-3. In one example, a floating diffusion capacitor 322 is coupled to the shared floating diffusion 318 as shown.

In operation, transfer transistor 316-0 is coupled to be controlled in response to a transfer control signal TX0, transfer transistor 316-1 is coupled to be controlled in response to a transfer control signal TX1, transfer transistor 316-2 is coupled to be controlled in response to a transfer control signal TX2, and transfer transistor 316-3 is coupled to be controlled in response to a transfer control signal TX3. As such, charge photogenerated in photodiode 304-0 in response to incident light is transferred to shared floating diffusion 318 in response to transfer control signal TX0, charge photogenerated in photodiode 304-1 in response to incident light is transferred to shared floating diffusion 318 in response to transfer control signal TX1, charge photogenerated in photodiode 304-2 in response to incident light is transferred to shared floating diffusion 318 in response to transfer control signal TX2, and charge photogenerated in photodiode 304-3 in response to incident light is transferred to shared floating diffusion 318 in response to transfer control signal TX3.

In the various examples, the incident light that is directed to the photodiodes 304-0 to 304-3 is directed through respective microlenses and color filters (e.g., R, G, B of FIG. 2) of the color filter array before reaching the photodiodes 304-0 to 304-3. Thus, the incident light may be directed through a red (R) color filter, or a green (G) color filter, or a blue (B) color filter before reaching the photodiodes 304-0 to 304-3.

Continuing with the example depicted in FIG. 3, a reset transistor 320 is coupled between a voltage supply (e.g., PIXVDD) and the shared floating diffusion 318. In operation, the reset transistor 320 is configured to reset pixel circuit 314 including the charge in shared floating diffusion 318 in response to a reset control signal RST.

As shown in the depicted example, a gate of a source follower transistor 324 is coupled to the shared floating diffusion 318. In the example, the drain of the source follower transistor 324 is coupled to the voltage supply (e.g., PIXVDD), and the source of source follower transistor 324 is coupled to a column bitline 312 through a row select transistor 326. Thus, in other words, the source follower transistor 324 and the row select transistor 326 are coupled between the voltage supply (e.g., PIXVDD) and the column bitline 312. In operation, the row select transistor 326 is configured to output a signal that is representative of the charge in shared floating diffusion 318 from the source follower transistor 324 of pixel circuit 314 to column bitline 312 in response to a row select signal RS.

An analog to digital converter (ADC) 332 is coupled to the column bitline 312 to perform ADC conversions of the analog signals received from pixel circuit 314 through column bitline 312. In the depicted example, the digital output of ADC 332 is shown as a digital output signal DOUT 336.

Figure 4:
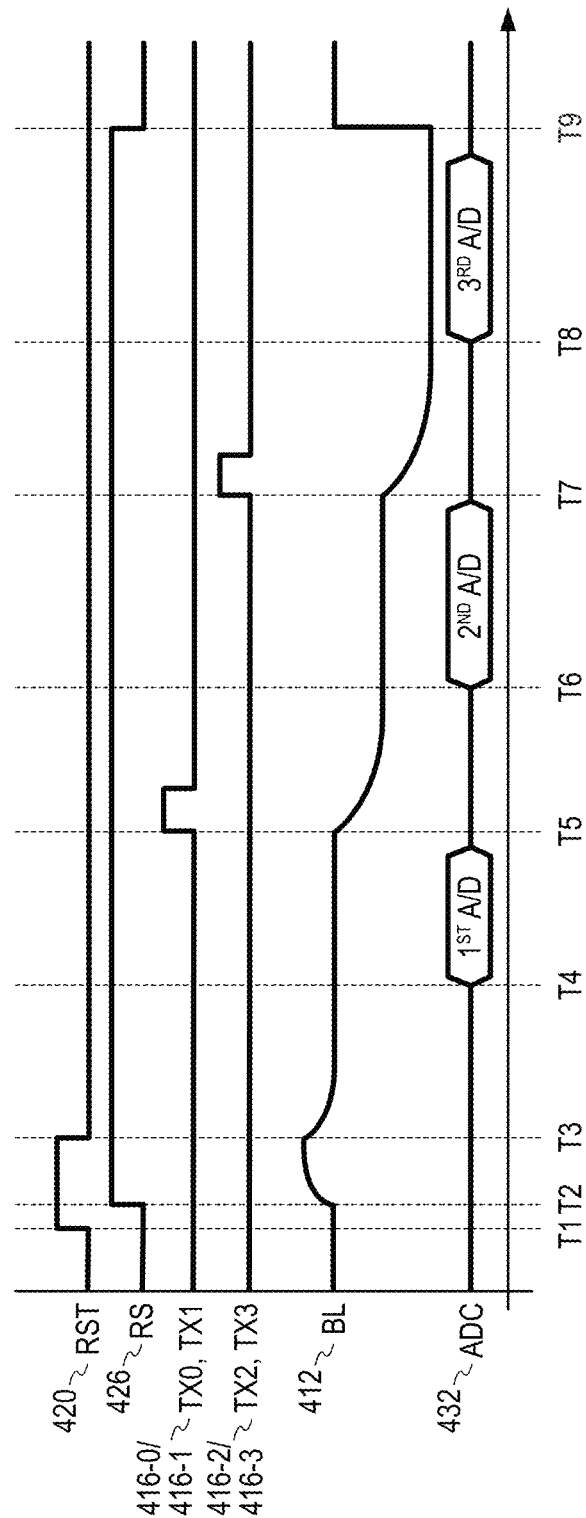
FIG. 4 illustrates one example timing diagram illustrating various signals in a pixel circuit included in an imaging system including a photodiode array from which signals are generated and read out by an analog to digital converter accordance with the teachings of the present invention.

FIG. 4 illustrates one example timing diagram 428 illustrating various signals in a pixel circuit included in an imaging system including a photodiode array from which signals are generated and read out by an analog to digital converter accordance with the teachings of the present invention. It is appreciated that the waveforms illustrated in FIG. 4 may be examples of waveforms found in pixel circuit 314 of FIG. 3, and/or in photodiode array 202 of FIG. 2, and/or imaging system 100 of FIG. 1, and that similarly named and numbered elements referenced below are coupled and function similar to as described above.

As shown in FIG. 4, timing diagram 428 illustrates a reset transistor control signal 420, a row select transistor control signal 426, transfer transistor control signal TX0 416-0, transfer transistor control signal TX1 416-1, transfer transistor control signal TX2 416-2, transfer transistor control signal TX3 416-3, bitline signal BL 412, and analog to digital converter (ADC) conversion operations 432.

At time T1, the reset transistor control signal 420 is asserted or pulsed while the transfer transistor control signals TX0 416-0 to TX3 416-3 remain turned off. As such, the reset transistor 320 is turned on while the transfer transistors 316-0 to 316-3 are turned off to reset the pixel circuit 314 including shared floating diffusion 318 at time T1.

As the shared floating diffusion 318 is being reset with the reset transistor 320 being turned on, the row select transistor control signal 426 is then asserted at time T2, which turns on the row select transistor 326. With the row select transistor 326 turned on at time T2, the bitline signal BL 412 begins to charge up until time T3, at which time the reset transistor control signal 420 is de-asserted or when the pulse in reset transistor control signal 420 ends, which turns off the reset transistor 320 at time T3. As such, the bitline signal BL 412 begins to settle to a reset level or reference level after time T3.

After the bitline signal BL 412 has settled, an ADC conversion operation 432 is performed by ADC 332 at time T4 to output a first ADC conversion of the bitline signal BL 412, which is representative of a reference readout at time T4.

Once the first ADC conversion 432 of the bitline signal BL 412 is complete, the transfer transistor control signals TX0 416-0 and TX1 416-1 are asserted or pulsed at time T5 while the reset transistor control signal 420 and the transfer transistor control signals TX2 416-2 and TX3 416-3 remain in the off state. Thus, the transfer transistors 316-0 and 316-1 are turned on at time T5 while the transfer transistors 316-2 and 316-3 remain turned off at time T5. As such, the charge that is photogenerated in photodiodes 304-0 and 304-1 is transferred to the shared floating diffusion 318 at time T5.

It is appreciated that in the example depicted in FIG. 3, photodiodes 304-0 and 304-1 represent the "top half" of the 2×2 arrangement of photodiodes. In another example, it is appreciated that the photodiodes 304-0 and 304-1 could represent the "left half" of the 2×2 arrangement of photodiodes.

As the charge is transferred to shared floating diffusion 318 at time T5 from the "top half" photodiodes 304-0 and 304-1, the bitline signal BL 412 begins to fall accordingly at time T5. After the charge has been transferred from photodiodes 304-0 and 304-1 to the shared floating diffusion 318, the transfer transistor control signals TX0 416-0 and TX1 416-1 are de-asserted, which turn off the transfer transistors 316-0 and 316-1. After the bitline signal BL 412 has settled, a second ADC conversion operation 432 is performed by ADC 332 at time T6 to output a second ADC conversion of the bitline signal BL 412, which is representative of a first half (e.g., top half) PDAF readout at time T6.

Once the second ADC conversion 432 of the bitline signal BL 412 is complete, the transfer transistor control signals TX0 416-2 and TX1 416-3 are asserted or pulsed at time T7 while the reset transistor control signal 420 and the transfer transistor control signals TX0 416-0 and TX1 416-1 remain in the off state. Thus, the transfer transistors 316-2 and 316-3 are turned on at time T7 while the transfer transistors 316-0 and 316-1 remain turned off at time T7. As such, the charge that is photogenerated in photodiodes 304-2 and 304-3 is transferred to or combined with the charge in the shared floating diffusion 318 at time T7.

It is noted that the charge in shared floating diffusion 318 is not reset a second time prior to the transfer of the charge from photodiodes 304-2 and 304-3 in accordance with the teachings of the present invention. It is also appreciated that in the example depicted in FIG. 3, photodiodes 304-2 and 304-3 represent the "bottom half" of the 2×2 arrangement of photodiodes. In another example, it is appreciated that the photodiodes 304-2 and 304-2 could represent the "right half" of the 2×2 arrangement of photodiodes.

With the additional charge transferred to shared floating diffusion 318 at time T7 from the "bottom half" photodiodes 304-2 and 304-3, the bitline signal BL 412 begins to fall again accordingly at time T7. After the additional charge has been transferred from photodiodes 304-2 and 304-3 to the shared floating diffusion 318, the transfer transistor control signals TX2 416-2 and TX3 416-3 are de-asserted, which turn off the transfer transistors 316-2 and 316-3. After the bitline signal BL 412 has settled again, a third ADC conversion operation 432 is performed by ADC 332 at time T8 to output a third ADC conversion of the bitline signal BL 412, which is representative of a full (e.g., top and bottom half) image readout at time T8.

Once the third ADC conversion 432 of the bitline signal BL 412 is complete, the row select transistor control signal 426 is then de-asserted at time T9, which turns off the row select transistor 326, causing the bitline signal BL 412 to return to its idle state value.

In summary, it is appreciated that three ADC conversions 432 are utilized to perform the readouts in accordance with the teachings of the present invention. The first ADC conversion (e.g., $D_{OUT1}$ is used to obtain the reference at time T4, the second ADC conversion (e.g., $D_{OUT2}$) is used to obtain the first half PDAF readout at time T6, and the third ADC conversion (e.g., $D_{OUT3}$) is used to obtain the full image readout at time T8.

In the signal processing, the correlated double sampling (CDS) or normalized "top half" PDAF reading can be determined by finding the difference between the second ADC conversion (e.g., $D_{OUT2}$) and the first ADC conversion (e.g., $D_{OUT1}$) or $D_{OUT2}-D_{OUT1}$. The "bottom half" (e.g., "second half") PDAF readout can be determined by finding the difference between the third ADC conversion (e.g., $D_{OUT3}$) and the second ADC conversion (e.g., $D_{OUT2}$) or $D_{OUT3}-D_{OUT2}$. The CDS or normalized version of the full image readout can be determined by finding the difference between the third ADC conversion (e.g., $D_{OUT3}$) and the first ADC conversion (e.g., $D_{OUT1}$ or $D_{OUT3}-D_{OUT1}$.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An imaging device, comprising:
   a plurality of photodiodes arranged in a photodiode array to generate charge in response to incident light, wherein the plurality of photodiodes includes a first photodiode, a second photodiode, a third photodiode, and a fourth photodiode;
   a shared floating diffusion configured to receive charge transferred from the first, second, third, and fourth photodiodes;
   a plurality of transfer transistors, wherein each one of the plurality of transfer transistors is coupled to a corresponding one of the plurality photodiodes, wherein the plurality of transfer transistors includes a first transfer transistor coupled between the first photodiode and the shared floating diffusion, a second transfer transistor coupled between the second photodiode and the shared floating diffusion, a third transfer transistor coupled between the third photodiode and the shared floating diffusion, and a fourth transfer transistor coupled between the fourth photodiode and the shared floating diffusion;
   a reset transistor coupled between the shared floating diffusion and a voltage supply;
   a source follower transistor having a gate coupled to the shared floating diffusion and a source coupled to a column bitline;
   a row select transistor coupled to the source follower transistor, wherein the source follower transistor and the row select transistor are coupled between the voltage supply and the column bitline; and
   an analog to digital converter (ADC) coupled to the column bitline, wherein the ADC is configured to perform a first ADC conversion to generate a reference readout in response to charge in the shared floating diffusion after a reset operation, wherein the reset operation is configured to be performed in response to the reset transistor being pulsed while simultaneously the first, second, third, and fourth transfer transistors are turned off to reset the shared floating diffusion, wherein the ADC is next configured to perform a second ADC conversion to generate a first half of a phase detection autofocus (PDAF) readout in response to the first and third transfer transistors being pulsed simultaneously while simultaneously the reset transistor and the second and fourth transfer transistors are turned off to transfer charge from the first and third photodiodes to the shared floating diffusion, wherein the ADC is then configured to perform a third ADC conversion to generate a full image readout in response to the second and fourth transfer transistors being pulsed simultaneously while simultaneously the reset transistor and the first and third transfer transistors are turned off to combine the charge transferred previously from the first and third photodiodes in the shared floating diffusion with charge transferred from the second and fourth photodiodes.

2. The imaging device of claim 1, wherein a second half of a PDAF readout is determined in response to a difference between the third ADC conversion and the second ADC conversion.

3. The imaging device of claim 2, wherein the first half of the PDAF readout is a top half of a PDAF readout, and the second half of the PDAF readout is a bottom half of a PDAF readout.

4. The imaging device of claim 2, wherein the first half of the PDAF readout is a left half of a PDAF readout, and the second half of the PDAF readout is a right half of a PDAF readout.

5. The imaging device of claim 1, wherein the first half of the PDAF readout is determined in response to a difference between the second ADC conversion and the first ADC conversion.

6. The imaging device of claim 1, wherein the full image readout is determined in response to a difference between the third ADC conversion and the first ADC conversion.

7. An imaging system, comprising:
a plurality of photodiodes arranged in a photodiode array to generate charge in response to incident light, wherein the plurality of photodiodes includes a first photodiode, a second photodiode, a third photodiode, and a fourth photodiode;
a shared floating diffusion configured to receive charge transferred from the first, second, third, and fourth photodiodes;
a plurality of transfer transistors, wherein each one of the plurality of transfer transistors is coupled to a corresponding one of the plurality photodiodes, wherein the plurality of transfer transistors includes a first transfer transistor coupled between the first photodiode and the shared floating diffusion, a second transfer transistor coupled between the second photodiode and the shared floating diffusion, a third transfer transistor coupled between the third photodiode and the shared floating diffusion, and a fourth transfer transistor coupled between the fourth photodiode and the shared floating diffusion;
a reset transistor coupled between the shared floating diffusion and a voltage supply;
a source follower transistor having a gate coupled to the shared floating diffusion and a source coupled to one of a plurality of column bitlines;
a row select transistor coupled to the source follower transistor, wherein the source follower transistor and the row select transistor are coupled between the voltage supply and said one of the plurality of column bitlines;
a control circuit coupled to the photodiode array to control operation of the photodiode array; and
a readout circuit coupled to the photodiode array to read out signals from the photodiode array through the plurality of column bitlines,
wherein the readout circuit includes an analog to digital converter (ADC) configured to perform a first ADC conversion to generate a reference readout in response to charge in the shared floating diffusion after a reset operation, wherein the reset operation is configured to be performed in response to the reset transistor being pulsed while simultaneously the first, second, third, and fourth transfer transistors are turned off to reset the shared floating diffusion,
wherein the ADC is next configured to perform a second ADC conversion to generate a first half of a phase detection autofocus (PDAF) readout in response to the first and third transfer transistors being pulsed simultaneously while simultaneously the reset transistor and the second and fourth transfer transistors are turned off to transfer charge from the first and third photodiodes to the shared floating diffusion,
wherein the ADC is then configured to perform a third ADC conversion to generate a full image readout in response to the second and fourth transfer transistors being pulsed simultaneously while simultaneously the reset transistor and the first and third transfer transistors are turned off to combine the charge transferred previously from the first and third photodiodes in the shared floating diffusion with charge from the second and fourth photodiodes.

8. The imaging system of claim 7, further comprising function logic coupled to the readout circuit to store digital representations of the signals from the photodiode array.

9. The imaging system of claim 7, wherein a second half of a PDAF readout is determined in response to a difference between the third ADC conversion and the second ADC conversion.

10. The imaging system of claim 9, wherein the first half of the PDAF readout is a top half of a PDAF readout, and the second half of the PDAF readout is a bottom half of a PDAF readout.

11. The imaging system of claim 9, wherein the first half of the PDAF readout is a left half of a PDAF readout, and the second half of the PDAF readout is a right half of a PDAF readout.

12. The imaging system of claim 7, wherein the first half of the PDAF readout is determined in response to a difference between the second ADC conversion and the first ADC conversion.

13. The imaging system of claim 7, wherein the full image readout is determined in response to a difference between the third ADC conversion and the first ADC conversion.

* * * * *